US007362250B2

United States Patent
Weibiao et al.

(10) Patent No.: US 7,362,250 B2
(45) Date of Patent: Apr. 22, 2008

(54) DYNAMIC DITHER FOR SIGMA-DELTA CONVERTERS

(75) Inventors: Zhang Weibiao, Plano, TX (US); James R. Hochschild, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/047,193

(22) Filed: Jan. 31, 2005

(65) Prior Publication Data

US 2006/0170576 A1    Aug. 3, 2006

(51) Int. Cl.
*H03M 3/00* (2006.01)
(52) U.S. Cl. ...................................... 341/143; 341/131
(58) Field of Classification Search ................ 341/143, 341/131
See application file for complete search history.

(56) References Cited

U.S. PATENT DOCUMENTS

| 5,144,308 | A  | * | 9/1992  | Norsworthy ........... 341/131 |
| 5,905,453 | A  | * | 5/1999  | Kase .................. 341/143 |
| 6,175,321 | B1 | * | 1/2001  | Frannhagen et al. ..... 341/143 |
| 6,268,814 | B1 | * | 7/2001  | Kolsrud ................ 341/131 |
| 6,326,911 | B1 | * | 12/2001 | Gomez et al. .......... 341/143 |
| 6,351,229 | B1 | * | 2/2002  | Wang .................. 341/143 |
| 6,426,714 | B1 | * | 7/2002  | Ruha et al. ........... 341/143 |
| 6,738,002 | B2 | * | 5/2004  | Ercan et al. .......... 341/131 |
| 2002/0145550 | A1 | * | 10/2002 | Korkala ............. 341/131 |
| 2003/0112163 | A1 | * | 6/2003  | Ercan et al. ........ 341/131 |
| 2005/0062626 | A1 | * | 3/2005  | Miller .............. 341/131 |

\* cited by examiner

*Primary Examiner*—Linh V. Nguyen
(74) *Attorney, Agent, or Firm*—Wade J. Brady, III; Frederick J. Telecky, Jr.

(57) ABSTRACT

A sigma-delta converter having dynamic dithering that reduces or removes idle-channel tones and increase linearity of the converter. The dither is differentiated in multiple orders before being applied to the converter quantizer. The differentiation order and the amplitude of the dither are determined dynamically based on the input signal amplitude in order to obtain the most effectiveness of dithering. The dynamic dither can be used in both analog-to-digital and digital-to-analog converters.

15 Claims, 4 Drawing Sheets

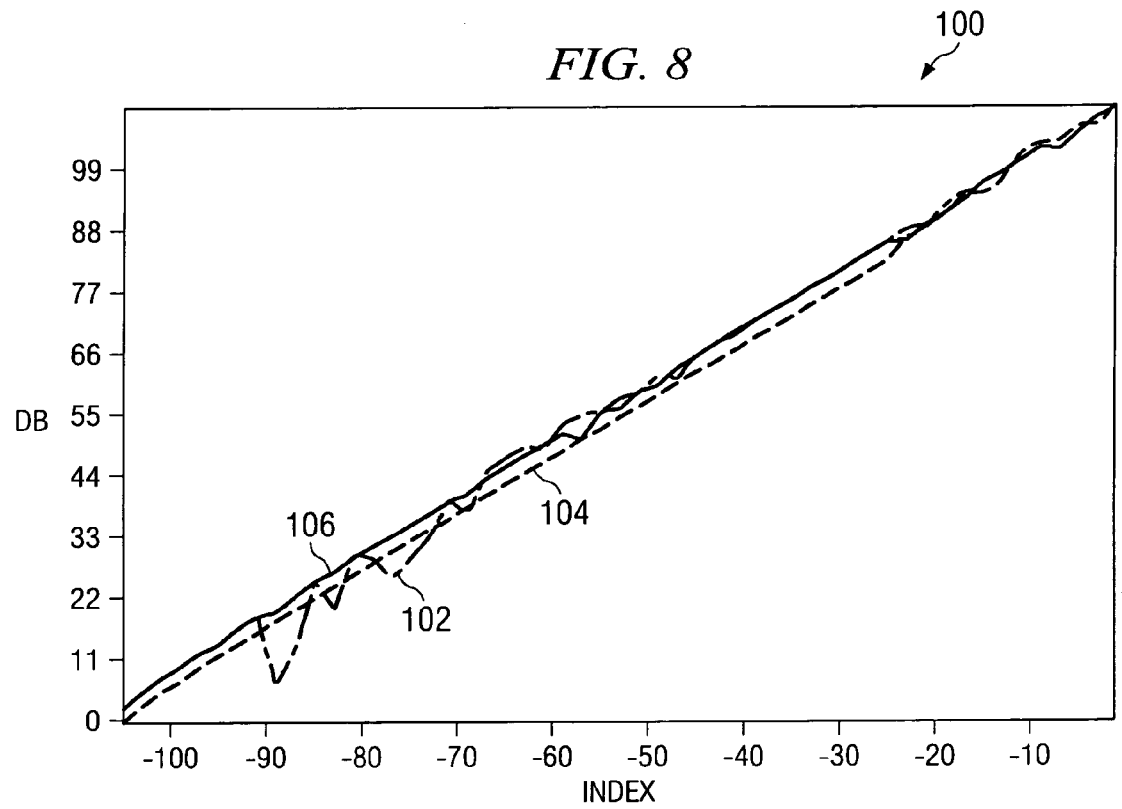

DYNAMIC DITHER FOR SIGMA-DELTA CONVERTERS

FIELD OF THE INVENTION

The present invention relates to sigma-delta converters, including those adapted for use in audio applications.

BACKGROUND OF THE INVENTION

Idle-channel tones exist in sigma-delta converters. In audio applications, the idle-channel tones can cause unpleasant noise detectable by the human ear. Dithering is the most popular method to reduce the idle-channel tones. One effective dithering method is to add a noise-shaped random series, called dither, in such a way that the dither transfer function is the same as the quantization noise transfer function. A sigma-delta modulator having generalized conventional dither is shown at 10 in FIG. 1. X(n) and y(n) are the input and output, respectively, of the modulator 10. G(z) is the feedforward Z transfer function, and H(z) is the feedback transfer function of the modulator. A pseudorandom series dither d(n) is added to the input of the quantizer.

From literature and simulations, the dithering amplitude must be big enough to remove the idle-channel tones. For example, an 1-bit quantizer, $\delta/\Delta > 0.5$, where $\delta$ is the peak-to-peak range of the dither, and $\Delta$ is the quantizer interval. When a fixed-amplitude of dither is applied all the time, the dithering is referred as static dithering. When adding a static dither to a modulator, the noise and distortion characteristics for large input signals are adversely affected. Noise floor of the sigma-delta modulator 10 may increase by several decibels. With static dither, when the input signal is approaching full scale, sigma-delta modulators have reduced dynamic range or dynamic range penalty. To avoid this effect, a dynamic dither that decreases its power when input level increases is preferred.

FIG. 2 shows a prior-art dynamic dither scheme at 20. The input 22 can be an analog signal for an analog-to-digital converter (ADC), or a digital signal for a digital-to-analog converter (DAC). A coarse input power level estimator 24 determines how much of the dither signal d(n) will be adjusted based on the input level of input 22. A quantizer Q, shown at 26, has an output fed back to form the negative-feedback loop. Dither signal d(n) is a random number series. Signal d'(n), which is proportional to dither d(n), can be digital for a DAC or analog for an ADC, and is determined by the output of the coarse input power level estimator 24 and dither d(n). In one example, if the input at 22 is idle or very small, signal d'(n) has a big amplitude, and it will attenuate with the input signal increase. Thus, this dither method 20 is called dynamic dithering. The attenuation factor is normally the function of the input amplitude. For example, $(1-|x(n)|^\alpha)$, where $\alpha=\frac{1}{4}$.

SUMMARY OF THE INVENTION

The present invention achieves technical advantages as a sigma-delta converter having dynamic dithering that reduces or removes idle-channel tones and increases linearity of the converter. The dither is differentiated in multiple orders before being applied to the quantizer of the converter. The differentiation order and the amplitude of the dither are determined dynamically based on the input signal amplitude in order to obtain the most effectiveness of dithering. The dynamic dither can be used in both analog-to-digital and digital-to-analog converters.

BRIEF DESCRIPTION OF THE DRAWINGS

FIG. 8 is a plot of SNDR versus input level plots for the dithers in Table 1.

DETAILED DESCRIPTION OF THE PREFERRED EMBODIMENT

Although a dynamic dither with uniformly distributed pseudorandom numbers is good enough for many applications, the present invention achieves technical advantages by providing more randomness of the pseudorandom numbers obtained by differentiating the uniformly distributed pseudorandom numbers. At the same time, this differentiation performs a noise shaping function (high-pass) to the dither, thus reducing the dither's noise power in signal-band. Thus, the differentiated dither generates an even better signal to noise ratio when the modulator is idle or with very small input amplitudes. The differentiation order of the dither can also be dynamically adjusted in order to get optimal signal-to-noise performance.

Figure 3:
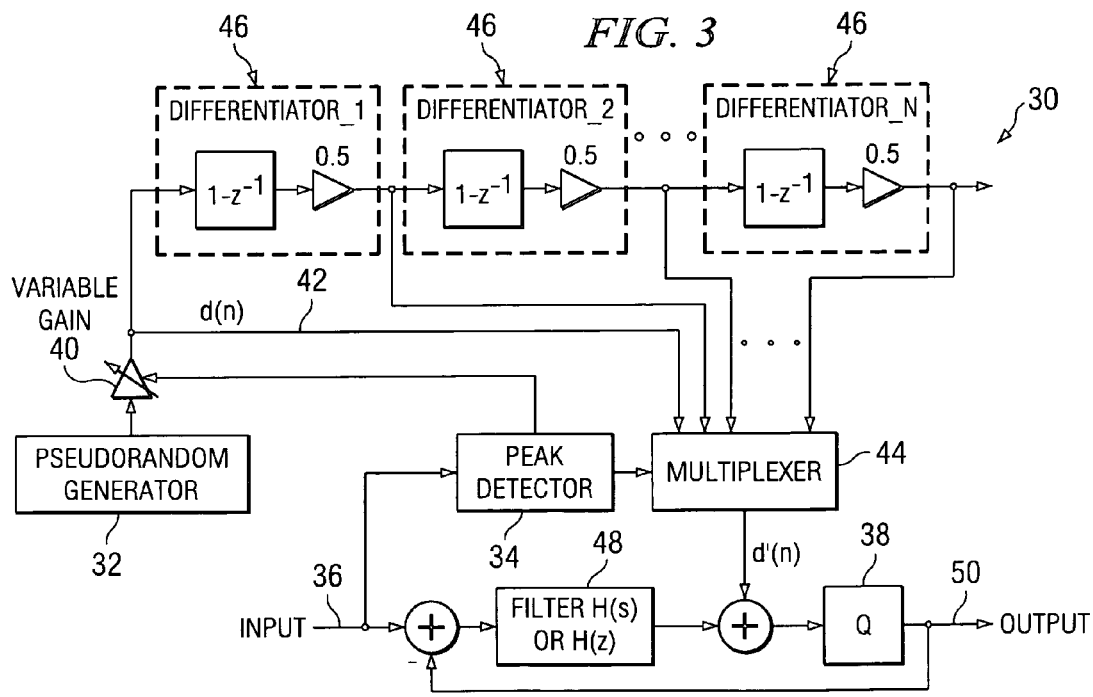
FIG. 3 is a diagram of one embodiment of the invention including a sigma-delta converter having differentiated dynamic dithering.

Referring to FIG. 3 there is shown a differentiated dynamic dithering scheme in a sigma-delta converter 30 according to one preferred embodiment of the invention. The converter 30 can be a DAC or an ADC. In the embodiment of FIG. 3, a pseudorandom generator 32 generates a uniformly distributed random number series. A peak detector 34 determines how big the input amplitude is relative to a full-scale input. For a DAC converter, the peak detector is conveniently placed to receive the digital input signal provided at input 36. For an ADC converter, it is more convenient to place the peak detector 34 after a quantizer Q, shown at 38, and a SINC filter (not shown) to get the amplitude represented digitally with reasonable short delay to apply dither soon enough.

Based on the input level of the digital input signal at input 36, the peak detector 34 sends a signal to a variable gain amplifier 40 to responsively set the dither signal d(n) amplitude as a function thereof. Advantageously, variable gain amplifier 40 also sends a signal 42 to a multiplexer 44 to responsively choose and establish a differentiation order. Every differentiator 46 has a transfer function of $(1-z^{-1})*0.5$, which makes its output have the same peak-to-peak range as its input. Differentiator_1's output connects to the input of the Differentiator_2, the output of Differentiator_2 connects to the input of the next Differentiator, and so on. All of the different outputs of differentiators 46 are connected to the multiplexer 44. The multiplexer's output d'(n) is added into the output of the filter 48, as shown. If the converter 30 is a DAC, then output d'(n) is a digital value. If the converter 30 is an ADC, then output d'(n) is an analog signal. The quantizer Q generates the converter output at 50, which output 50 is fed back to the converter input to form a negative-feedback loop. An unlimited number of differentiators may be used in theory, but for minimal cost of silicon, a limited number of differentiators or differentiation order is chosen as desired. The number of the differentiation order, and the variable gain, are optimized given the order of the sigma-delta converter and the quantizer architecture.

Figure 1:
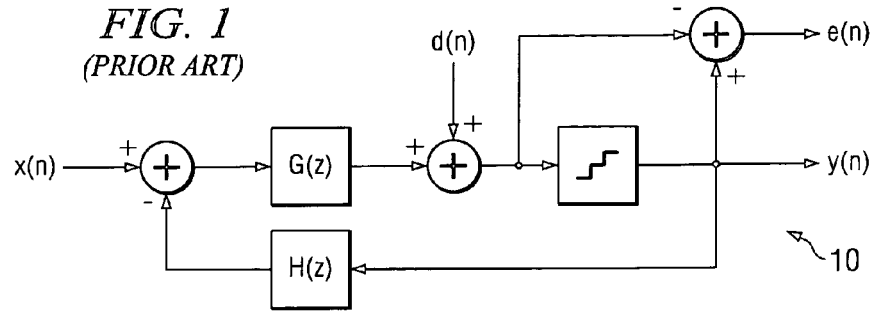
FIG. 1 is a diagram of a conventional sigma-delta converter having static dithering.
Figure 2:
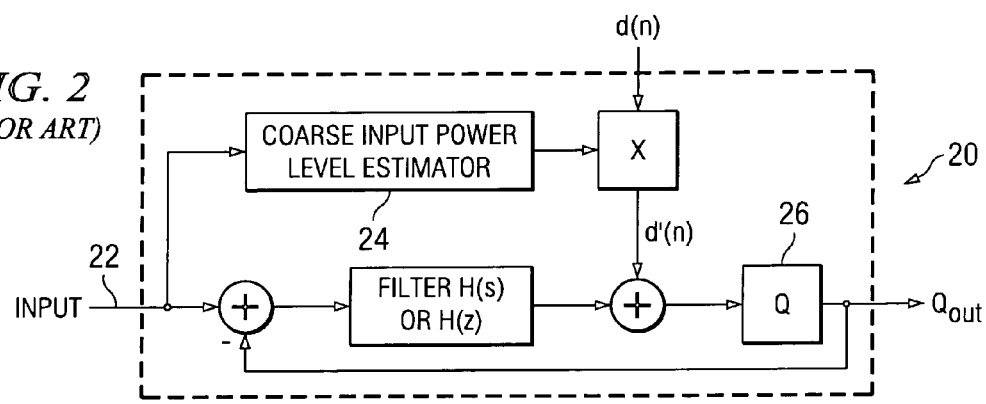
FIG. 2 is a diagram of a conventional sigma-delta converter having dynamic dithering.

To simulate the dynamic dithering shown in FIG. 2, the gain is adjusted as in Table 1 below, and signal d'(n) is always equal to d(n).

TABLE 1

| INPUT AMPLITUDE RELATIVE TO FULL-SCALE | GAIN |
|---|---|
| (−∞~−30 dB) | 1 |
| [−30 dB, −24 dB) | ½ |
| [−24 dB, −18 dB) | ¼ |
| [−18 dB, −12 dB) | 1/8 |
| [−12 dB, −6 dB) | 1/16 |
| [−6 dB, 0 dB) | 1/32 |
| [0 dB, +∞) | 0 |

Referring now to Table 2 below there is shown a dynamic differentiation order and gain based on input amplitude according to one embodiment of the present invention.

TABLE 2

| INPUT AMPLITUDE RELATIVE TO FULL-SCALE | GAIN | DIFFERENTIATION ORDER |
|---|---|---|
| (−∞~−90 dB) | 2 | 3 |
| [−90 dB, −30 dB) | 1 | 0 |
| [−30 dB, −24 dB) | 1/2 | 0 |
| [−24 dB, −18 dB) | 1/4 | 0 |
| [−18 dB, −12 dB) | 1/8 | 0 |
| [−12 dB, −6 dB) | 1/16 | 0 |
| [−6 dB, 0 dB) | 1/32 | 0 |
| [0 dB, +∞) | 0 | 0 |

Figure 4:
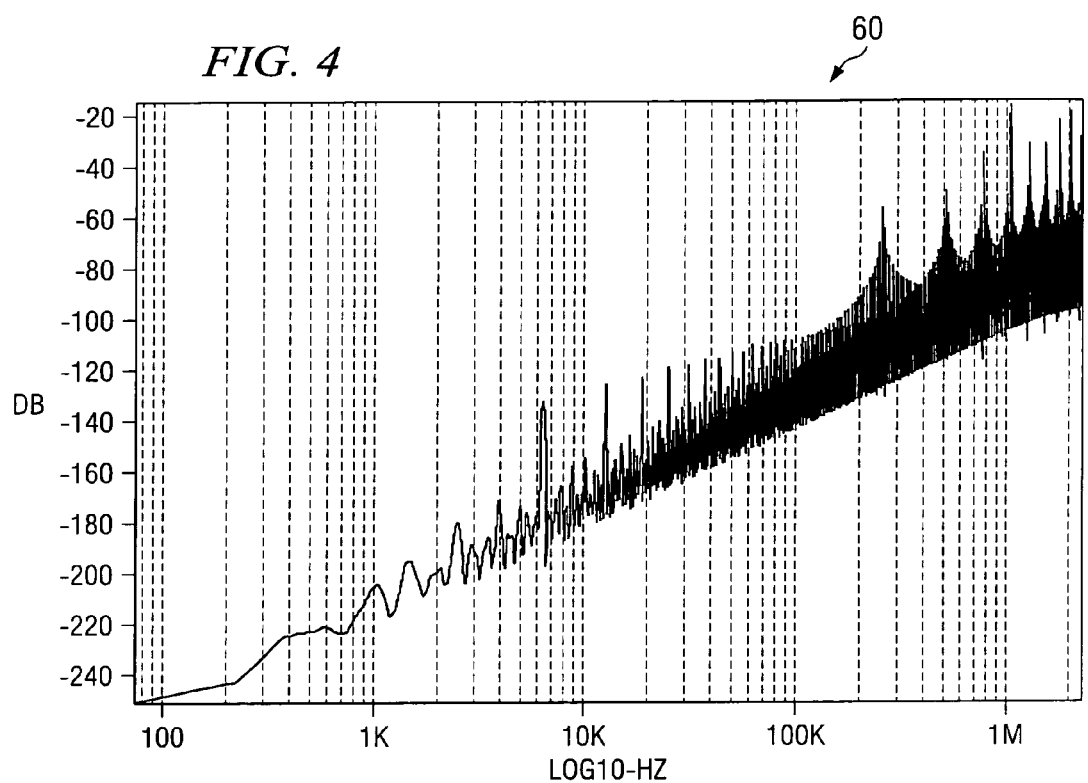
FIG. 4 is a FFT plot of idle-channel noise of a converter without dither.

FIG. 4 shows at 60 an idle-channel noise FFT plot for a second-order nine-level sigma-delta DAC with a sampling frequency of 4.8 MHz without dither. The DAC input is a short-time sine wave followed by long-time 0. Tones are apparent.

Figure 5:
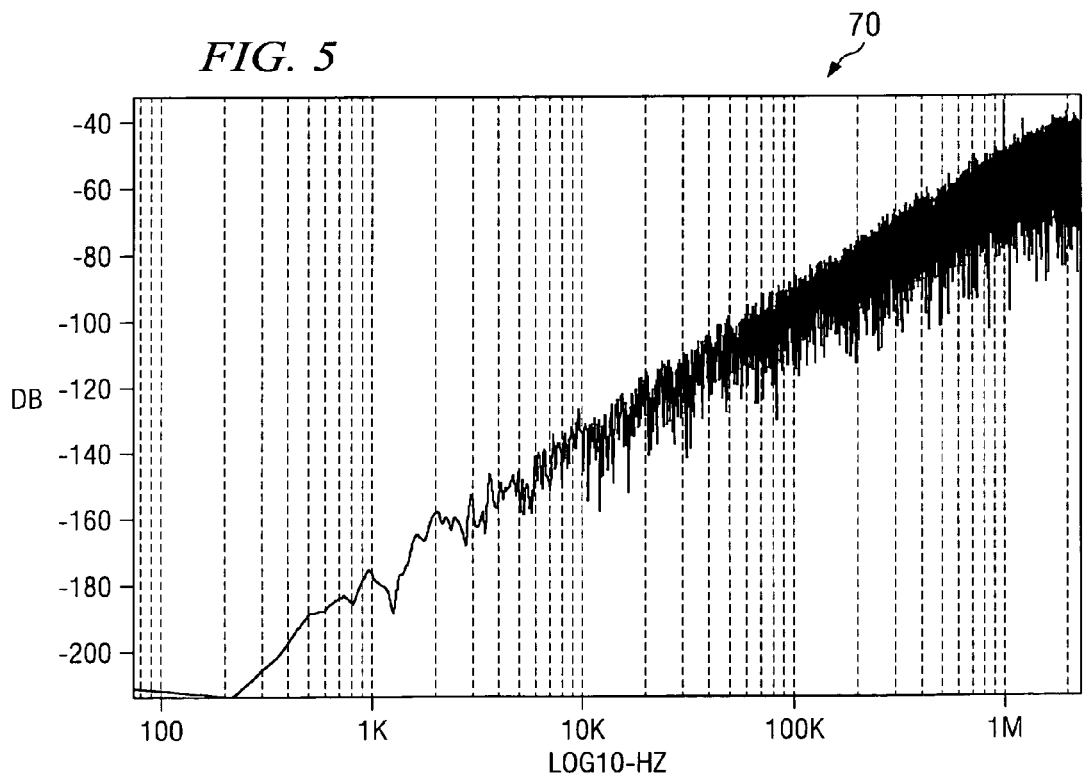
FIG. 5 is a FFT plot of idle-channel noise of a converter with dither gain adjusted according to the input signal level.

FIG. 5 shows at 70 the same DAC with the prior-art dither of Table 1 (dither gain is adjusted according to the input signal level). The tones are effectively removed.

Figure 6:
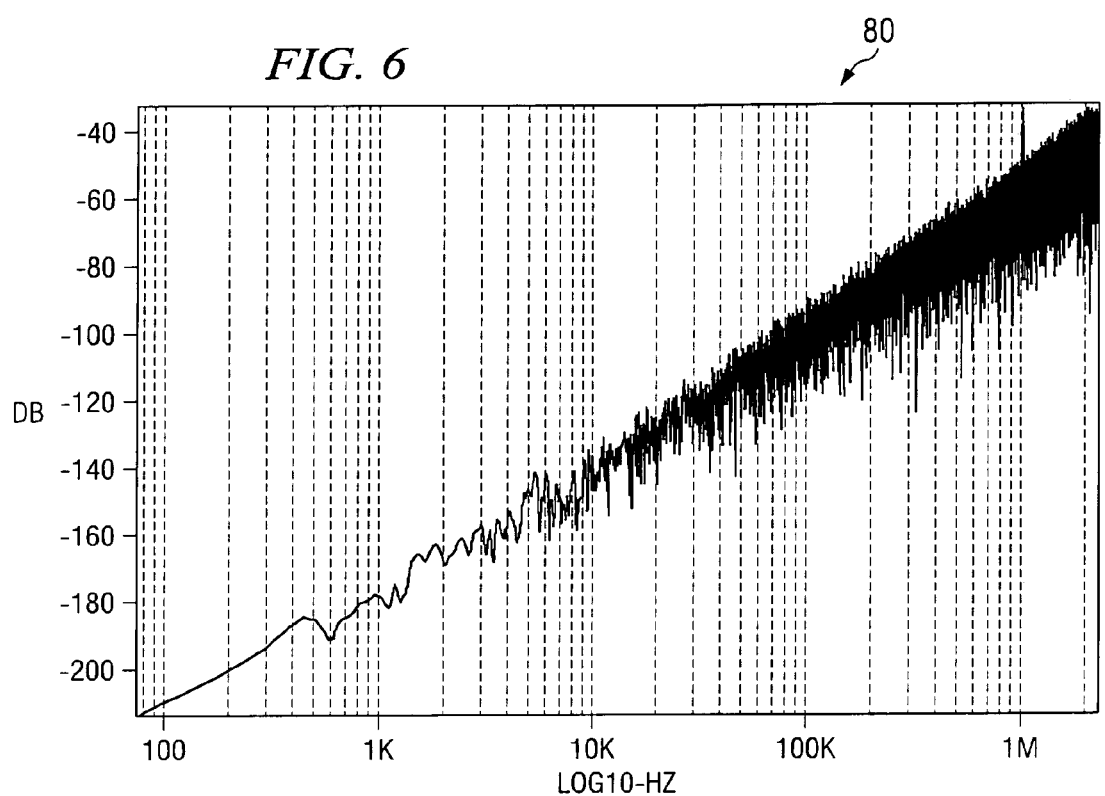
FIG. 6 is a FFT plot of idle-channel noise dither for one embodiment of the present invention.

FIG. 6 shows at 80 the same DAC with new dither in Table 2 according to one embodiment of the present invention. When the input level is lower than −90 dBFS (meaning dB relative to Full-Scale), the differentiation order is set to 3 and the dither gain is set to 2. When the input level is higher than −90 dBFS, the differentiation order is 0 and the gain is set to the same as the prior-art dither. The differentiation order can be set to 1 or 2 instead of 0 when the input increases, and the gain needs to be set accordingly to get close to optimal result. The dithers in Table 1 and Table 2 are both effective to remove idle-channel tones. However, the new dither according to the present invention is better than the prior-art dither because the tones appearing at the high frequency range is several dB lower.

Figure 7:
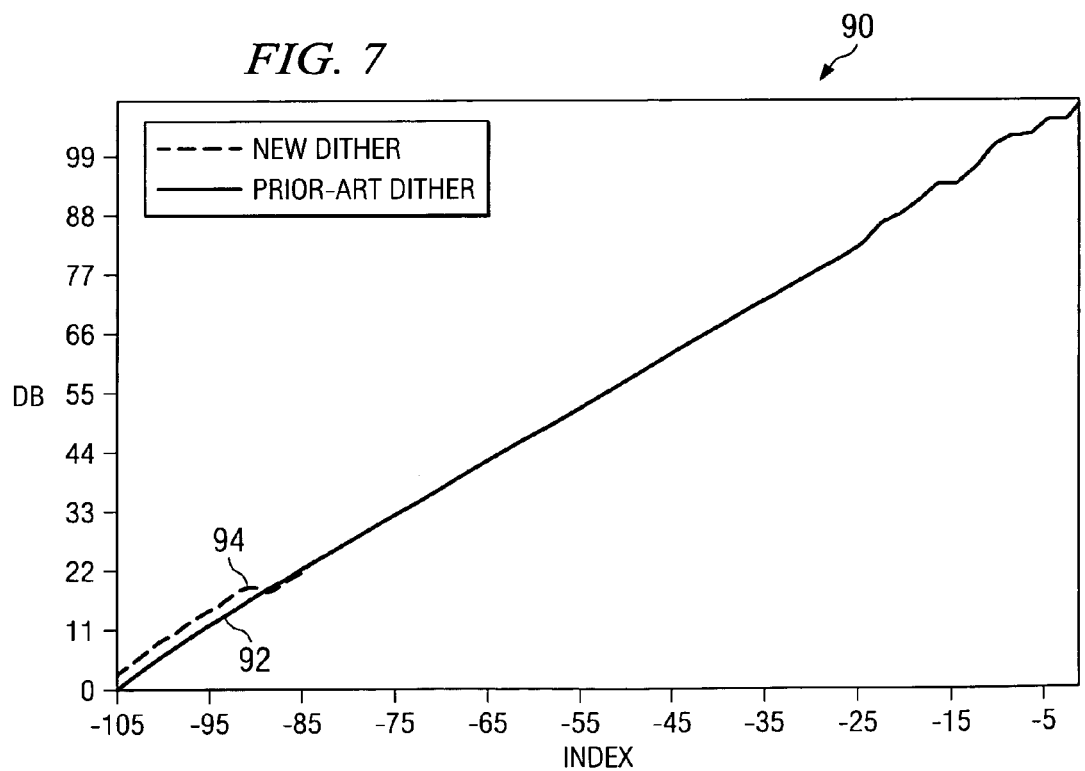
FIG. 7 is a plot of simulated signal-to-noise-and-distortion (SNDR) versus input signal amplitude.

FIG. 7 shows at 90 a plot of simulated Signal-to-Noise-and-distortion (SNDR) versus input amplitude level. When the input level is lower than −90 dBFS, SNDR for the new dither (Table 2), shown at 94, is consistently several dB higher than the prior-art dither (Table 1), shown at 92, and is the same when the input level is higher than −90 dBFS.

Since higher SNDR can be obtained at low input levels when the differentiation order is set high, the differentiation order can be always set to high as in Table 3.

TABLE 3

Fixed Differentiation Order

| INPUT AMPLITUDE RELATIVE TO FULL-SCALE | GAIN | DIFFERENTIATION ORDER |
|---|---|---|
| −∞~−90 dB | 2 | 3 |
| [−90 dB, −30 dB) | 1 | 3 |
| [−30 dB, −24 dB) | 1/2 | 3 |
| [−24 dB, −18 dB) | 1/4 | 3 |
| [−18 dB, −12 dB) | 1/8 | 3 |
| [−12 dB, −6 dB) | 1/16 | 3 |
| [−6 dB, 0 dB) | 1/32 | 3 |
| [0 dB, +∞) | 0 | 3 |

The differentiation order can also be adjusted gradually from high to low as in Table 4.

TABLE 4

More Dynamic Differentiation Orders and Gains

| INPUT AMPLITUDE RELATIVE TO FULL-SCALE | GAIN | DIFFERENTIATION ORDER |
|---|---|---|
| (−∞~−72 dB) | 2 | 3 |
| [−72 dB, −48 dB) | 1.5 | 2 |
| [−48 dB, −30 dB) | 1.2 | 1 |
| [−30 dB, −24 dB) | 1/2 | 0 |
| [−24 dB, −18 dB) | 1/4 | 0 |
| [−18 dB, −12 dB) | 1/8 | 0 |
| [−12 dB, −6 dB) | 1/16 | 0 |
| [−6 dB, 0 dB) | 1/32 | 0 |
| [0 dB, +∞) | 0 | 0 |

FIG. 8 shows at 100 the SNDR versus input level plots for the dithers in Table 1 (Prior-art), Table 3, and Table 4. The X-axis is the input amplitude relative to the full scale. The Y-axis is the SNDR. The prior-art dithering of Table 1 is shown at 104, the dithering of Table 3 is shown at 102, and line 106 shows the dithering of Table 4. It is appreciated in these plots, by gradually adjusting the differentiation order, the SNDR curve is smoother, and thus is a preferred way of implementing the dithering with dynamic differentiation order and gain adjustment with the input levels. The SNDR for this improved dither is higher than or the same as the prior-art dither.

Though the invention has been described with respect to a specific preferred embodiment, many variations and modifications will become apparent to those skilled in the art upon reading the present application. It is therefore the intention that the appended claims be interpreted as broadly as possible in view of the prior art to include all such variations and modifications.

We claim:

1. A sigma-delta converter, comprising:
   a modulator adapted to modulate an input signal;
   a dither providing a dynamic dither signal having a dither amplitude that varies inversely as an input amplitude of the input signal; and
   a quantizer quantizing the modulated input signal as a function of the dynamic dither signal, wherein the dynamic dither signal is differentiated;
   wherein the differentiated dither signal is generated by a plurality of differentiators having a same transfer function; and an output of one of the differentiators is fed to the input of another of the differentiators.

2. The sigma-delta converter as specified in claim 1, wherein the differentiated dither signal performs noise shaping of the dither signal.

3. The sigma-delta converter as specified in claim 1, wherein the differentiated dither signal reduces noise power of the dither signal in signal-band.

4. The sigma-delta converter as specified in claim 1, wherein the differentiated dither signal comprises non-uniformly distributed pseudorandom numbers.

5. The sigma-delta converter as specified in claim 1, wherein the non-uniform pseudorandom numbers are random.

6. The sigma-delta converter as specified in claim 1, further comprising a signal processor establishing a differentiation order of the dither signal.

7. The sigma-delta converter as specified in claim 6, wherein the signal processor comprises a multiplexer.

8. The sigma-delta converter as specified in claim 1, further comprising an amplifier providing a control signal, the signal processor establishing a differentiation order as a function of the control signal.

9. The sigma-delta converter as specified in claim 8, wherein the amplifier comprises a variable gain amplifier.

10. The sigma-delta converter as specified in claim 1, wherein the modulator has a negative-feedback loop.

11. A sigma-delta converter, comprising:
a modulator adapted to modulate an input signal;
a dither providing a dynamic dither signal;
a quantizer quantizing the modulated input signal as a function of the dynamic dither signal, wherein the dynamic dither signal is differentiated,
a signal processor establishing a differentiation order of the dither signal;
a peak detector coupled to the input signal and controlling the signal processor;
a pseudorandom number generator generating the dither signal; and
a variable gain amplifier receiving the dither signal;
wherein the variable gain amplifier amplifies the dither signal as a function of the peak detector.

12. The sigma-delta converter as specified in claim 11, wherein the amplified dither signal controls the signal processor.

13. A sigma-delta converter, comprising:
a modulator adapted to modulate an input signal;
a dither providing a dynamic dither signal; the dither including a pseudorandom generator;
a quantizer quantizing the modulated input signal as a function of the dynamic dither signal;
a peak detector adapted, configured and connected to determine a relative amplitude of the input signal;
a plurality of at least three differentiators, each having a same transfer function, and being connected with an output of a first and second differentiator respectively connected to an input of the second and a third differentiator;
a variable gain amplifier that amplifies the dither signal and sets a dither signal amplitude responsive to the peak detector; and
a signal processor including a multiplexer connected to receive outputs from each differentiator and adapted to establish a differentiation order responsive to a control signal from the variable gain amplifier.

14. The sigma-delta convener as specified in claim 13, wherein the differentiators have the same transfer function $(1-Z^{-1}) * 0.5$.

15. The sigma-delta convener as specified in claim 13, wherein the pseudorandom generator is configured to generate a dither signal based on a uniformly distributed random number series.

* * * * *